US007053492B2

(12) United States Patent
Takahashi et al.

(10) Patent No.: US 7,053,492 B2
(45) Date of Patent: May 30, 2006

(54) CIRCUIT DEVICE AND METHOD OF MANUFACTURING THE SAME

(75) Inventors: Kouji Takahashi, Gunma (JP); Kazuhisa Kusano, Gunma (JP); Noriaki Sakamoto, Gunma (JP)

(73) Assignees: Sanyo Electric Co., Ltd., Osaka (JP); Kanto Sanyo Semiconductors Co., Ltd., Gunma (JP)

( * ) Notice: Subject to any disclaimer, the term of this patent is extended or adjusted under 35 U.S.C. 154(b) by 0 days.

(21) Appl. No.: 10/632,623

(22) Filed: Aug. 1, 2003

(65) Prior Publication Data

US 2004/0056357 A1    Mar. 25, 2004

(30) Foreign Application Priority Data

Aug. 7, 2002    (JP) .................. P. 2002-230410

(51) Int. Cl.
    H01L 23/52    (2006.01)
    H01L 23/48    (2006.01)
    H01L 29/40    (2006.01)

(52) U.S. Cl. .................. 257/783; 257/782; 257/784; 257/778; 257/737; 257/738

(58) Field of Classification Search .................. None
    See application file for complete search history.

(56) References Cited

U.S. PATENT DOCUMENTS

| 5,756,380 | A  | * | 5/1998  | Berg et al. ............. 438/126 |
| 6,261,864 | B1 | * | 7/2001  | Jung et al. ............. 438/106 |
| 6,528,893 | B1 | * | 3/2003  | Jung et al. ............. 257/787 |
| 6,617,680 | B1 | * | 9/2003  | Chien-Chih et al. ...... 257/698 |
| 6,635,956 | B1 | * | 10/2003 | Sakamoto et al. ........ 257/678 |
| 6,703,696 | B1 | * | 3/2004  | Ikenaga et al. .......... 257/678 |
| 6,706,547 | B1 | * | 3/2004  | Sakamoto et al. .......... 438/33 |
| 6,737,736 | B1 | * | 5/2004  | Abe et al. ............... 257/676 |
| 6,818,538 | B1 | * | 11/2004 | Chiang et al. ............ 438/611 |
| 6,889,428 | B1 | * | 5/2005  | Igarashi et al. ............ 29/832 |
| 6,955,942 | B1 | * | 10/2005 | Kobayashi et al. ........ 438/106 |
| 6,964,918 | B1 | * | 11/2005 | Fan et al. ................ 438/614 |
| 2002/0133943 | A1 | * | 9/2002 | Sakamoto et al. ........... 29/846 |
| 2005/0088806 | A1 | * | 4/2005 | Kato et al. ................ 361/600 |

FOREIGN PATENT DOCUMENTS

JP    2001-352034    * 12/2001    .................. 25/7

* cited by examiner

*Primary Examiner*—Nathan J. Flynn
*Assistant Examiner*—Victor A. Mandala, Jr.
(74) *Attorney, Agent, or Firm*—Fish & Richardson P.C.

(57) ABSTRACT

The overflow of a brazing material (19) from a die pad (11) is prevented by forming a second plating film (14B) on the surface of the die pad (11). The second plating film (14B) is provided around the surface of the die pad 11 so as to enclose an area where a semiconductor element (13) is mounted. In a step of mounting the semiconductor element (13) on the die pad (11) with the brazing material (19), the brazing material (19) overflows from the first plating film (14A) when the semiconductor element (13) is mounted on the upper part of the molten brazing material. However, the second plating film (14B) functions as a blocking area by which the overflow of the brazing material is prevented. Therefore, a short circuit can be prevented from arising between the die pad (11) and the bonding pad (12) because of the brazing material that has spread.

18 Claims, 12 Drawing Sheets

CIRCUIT DEVICE AND METHOD OF MANUFACTURING THE SAME

BACKGROUND OF THE INVENTION

1. Field of the Invention

The present invention relates to circuit devices capable of preventing a brazing material used to fix a semiconductor element from overflowing and relates to a method of manufacturing the circuit device.

2. Description of the Related Art

Figure 13:
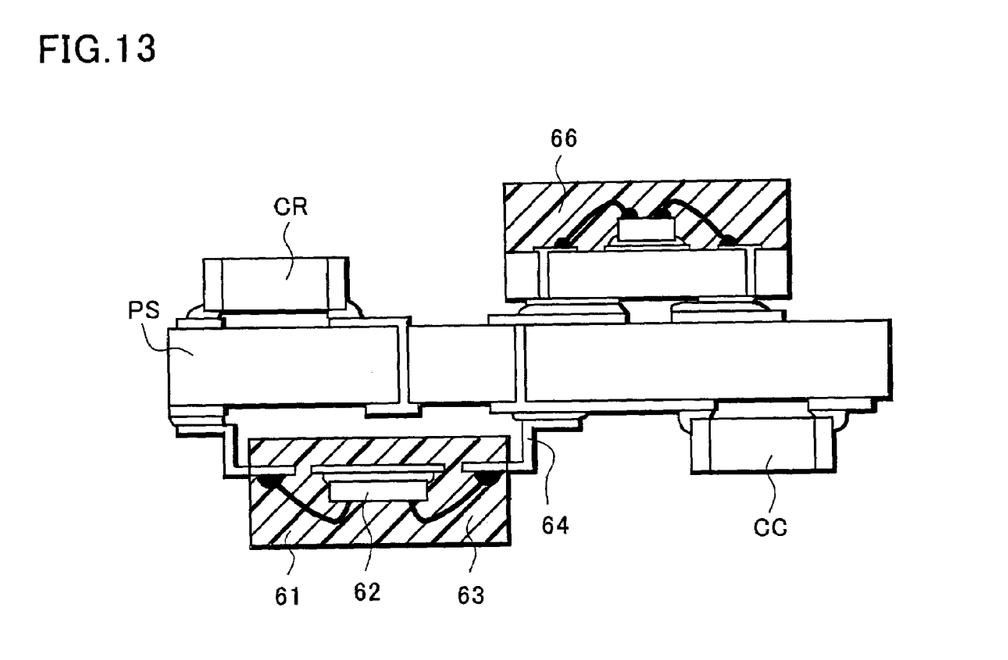
FIG. 13 is a sectional view describing the conventional circuit device.

Conventionally, circuit devices to be set in an electronic apparatus have been required to be reduced in size, in thickness, and in weight, since the circuit devices are used for portable telephones, portable computers and so on. For example, a semiconductor device as a circuit device is typically a package type semiconductor device which is conventionally sealed by normal transfer molding. This semiconductor device is mounted on a printed circuit board PS as shown in FIG. 13.

This package type semiconductor device 61 has a semiconductor chip 62 covered with a resin layer 63, with a lead terminal 64 for external connection derived from the side of this resin layer 63. However, this package type semiconductor device 61 had the lead terminal 64 out of the resin layer 63, and was too large in total size to meet the requirements of small size, low-profile and lightweight. Therefore, various companies have competed to develop a wide variety of structures that are reduced in size, thickness and weight. Recently, a wafer scale CSP which is as large as a chip size, called a CSP (Chip Size Package), or a CSP which is slightly larger than the chip size, has been developed.

Figure 14:
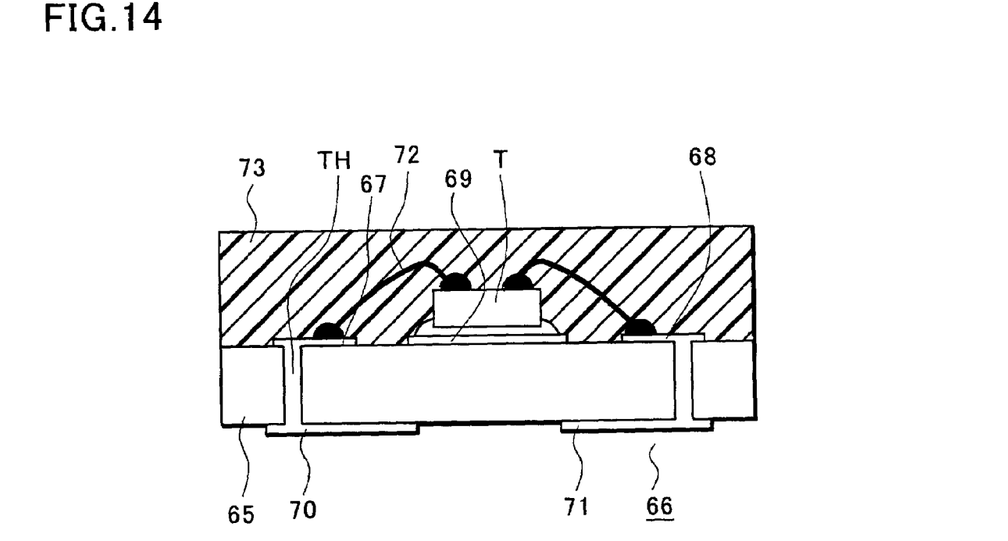
FIG. 14 is a sectional view describing the conventional circuit device.

FIG. 14 shows a CSP 66 that adopts a glass epoxy substrate 65 as a support substrate and that is slightly larger than the chip size. Herein, a transistor chip T is mounted on the glass epoxy substrate 65.

A first electrode 67, a second electrode 68, and a die pad 69 are formed on the surface of the glass epoxy substrate 65, and a first back electrode 70 and a second back electrode 71 are formed on the back surface thereof. Via a through hole TH, the first electrode 67 and the first back electrode 70, as well as the second electrode 68 and the second back electrode 71, are electrically connected together. The bare transistor chip T is fixed onto the die pad 69. An emitter electrode of the transistor and the first electrode 67 are connected together through a fine metal wire 72, and a base electrode of the transistor and the second electrode 68 are connected together through the fine metal wire 72. Furthermore, a resin layer 73 is provided on the glass epoxy substrate 65 to cover the transistor chip T.

The CSP 66 adopts the glass epoxy substrate 65, which has the merits of a simpler structure extending from the chip T to the back electrodes 70 and 71 for external connection, and a less expensive cost of manufacture than the wafer scale CSP. The CSP 66 is mounted on the printed circuit board PS, as shown in FIG. 13. The printed circuit board PS is provided with the electrodes and wires making up an electric circuit, and has the CSP 66, the package type semiconductor device 61, a chip resistor CR, or a chip capacitor CC fixed for the electrical connection. The circuit on this printed circuit board is packaged in various sets.

However, in the aforementioned semiconductor device, the transistor T is fixed through a reflow process in which a brazing material, such as solder, applied onto the die pad 69 is melted. Therefore, disadvantageously, molten solder overflows from the die pad 69, and the die pad 69 is short-circuited with other electrodes when the transistor T is placed on the molten solder.

Additionally, the die pad 69 is disposed apart from the second electrode 68 in order to prevent the solder that has overflowed from the die pad 69 from reaching the second electrode 68. This has brought about an increase in size of the whole of the device.

The present invention has been made in consideration of these problems. It is therefore a primary object of the present invention to provide circuit devices capable of preventing a brazing material from flowing out from a die pad when a semiconductor element is mounted on the die pad with the brazing material.

SUMMARY OF THE INVENTION

The present invention is characterized in that circuit devices comprises a die pad on which a semiconductor element is mounted with a brazing material, a bonding pad disposed in close vicinity to the die pad, and plating films formed on a surface of the die pad and on a surface of the bonding pad, respectively, in which a second plating film for preventing the brazing material from overflowing is disposed around and apart from a first plating film on which the semiconductor element of the die pad is mounted, and the brazing material that has overflowed from the first plating film is prevented from flowing out by a space between the first and second plating films.

The present invention is further characterized in that convex portions are provided at both sides, respectively, of the first plating film, and the brazing material is spread around the first plating film by causing the brazing material to flow from the convex portions.

The present invention is further characterized in that the semiconductor element is maintained in parallel by spreading the brazing material from the first plating film by the convex portions.

The present invention is further characterized in that the semiconductor device is an IC chip.

The present invention is further characterized in that the semiconductor element is electrically connected to a desired bonding pad among the bonding pads through a fine metal wire.

The present invention is further characterized in that circuit devices comprise a die pad on which a semiconductor element is mounted, a first bonding pad disposed in close vicinity to the die pad and electrically separated from the die pad, a second bonding pad disposed in close vicinity to the die pad and formed integrally with the die pad, and an insulating resin for sealing the semiconductor element, the die pad, the first bonding pad, and the second bonding pad while exposing a back surface of the die pad, a back surface of the first bonding pad, and a back surface of the second bonding pad outward, in which an area in which the second bonding pad is in contact with the insulating resin is increased by connecting the second bonding pad to the die pad through a wiring portion narrow in width, so that joining is strengthened between the bonding pad and the insulating resin.

The present invention is further characterized in that a plurality of first bonding pads each of which is mentioned above are disposed along the opposite sides of the die pad.

The present invention is further characterized in that a plurality of second bonding pads each of which is mentioned above are disposed along the opposite sides of the die pad.

The present invention is further characterized in that the semiconductor element is electrically connected to a desired first bonding pad and to a desired second bonding pad through fine metal wires.

The present invention is further characterized in that the first bonding pad and the second bonding pad are formed circularly.

The present invention is further characterized in that circuit devices comprise a die pad on which a semiconductor element is mounted, bonding pads arranged to enclose the die pad, a first external electrode disposed on a back surface of the die pad, a second external electrode disposed on a back surface of the bonding pad, and a resist that has openings at positions corresponding to the first and second external electrodes and that covers the back surfaces thereof, in which the opening of the resist disposed at the position corresponding to the second external electrode is formed larger than the bonding pad, and a size of the second external electrode is restricted according to wettability of the back surface of the bonding pad exposed from the opening and according to an amount of a brazing material, which is a material of the external electrode, applied onto the back surface of the bonding pad.

The present invention is further characterized in that the first external electrode is restricted in position and in size according to the opening of the resist.

The present invention is further characterized in that the circuit devices manufacturing method comprises a step of preparing a conductive foil; a step of forming die pads and bonding pads that constitute a plurality of the circuit devices portions by forming a separation groove in the conductive foil, the separation groove being smaller in thickness than the conductive foil; a step of forming a first plating film on a surface of the die pad corresponding to an area of a semiconductor element to be fixed and, at the same time, forming a second plating film so as to enclose the area thereof; a step of fixing the semiconductor element onto the first plating film with a brazing material; a step of performing wire bonding between the semiconductor element and a desired conductive pattern; a step of performing common molding by use of an insulating resin so that the semiconductor element is covered with the insulating resin and the separation groove is filled with the insulating resin; a step of removing a back surface of the conductive foil until the insulating resin is exposed; and a step of dicing the insulating resin so as to be separated into each circuit device.

The present invention is further characterized in that a convex portion is disposed at a periphery of the first plating film, and the semiconductor element is maintained in parallel by causing the brazing material to flow from the convex portion.

The present invention is further characterized in that the brazing material is prevented from flowing from the surface of the die pad by causing the brazing material to flow from the convex portion along the second plating film.

The present invention is further characterized in that the brazing material is solder or an Ag paste.

The present invention can achieve the following effects.

First, the second plating film 14B is provided around the die pad 11 so as to enclose the semiconductor element 13, so that the brazing material 19 fixing the semiconductor element 13 can be prevented from overflowing in the present invention. Therefore, the brazing material 19 that has overflowed can be prevented from causing a short circuit between conductive patterns.

Second, in the step of mounting the semiconductor element 13, since the convex portion 14D is provided on both sides of the first plating film 14A where the semiconductor element 13 is mounted, the brazing material 19 can be caused to flow out from the part where the convex portion 14D is disposed. Therefore, the brazing material 19 can be caused to evenly flow out, and, as a result, the thickness of the brazing material 19 can be made constant. Furthermore, the semiconductor element 13 can be mounted in parallel with the conductive foil.

Third, since the second bonding pad 12B and the die pad 11 that are sealed with the insulating resin 16 are connected together through the wiring portion 20, the area of the side faces of the second bonding pad 12B and the die pad 11 can be increased. Therefore, an area where the bonding pad 12B, the die pad 11, and the insulating resin 16 are in contact with each other can be increased, and, as a result, the bonding strength among them can be increased. From this fact, the bonding pad 12 and the die pad 11 can be prevented from peeling off from the insulating resin 16.

Fourth, the first external electrode formed on the back surface of the die pad 11 is restricted in its position and size by the first opening 21B of the resist 18, and, likewise, the second external electrode 17B formed on the back surface of the bonding pad 12 is restricted in its position and size by the wettability of the back surface of the bonding pad 12. Therefore, the second external electrode 17B can be prevented from being deformed even when the opening 21 of the resist 18 deviates from a normal position.

BRIEF DESCRIPTION OF THE DRAWINGS

FIG. 1 is a plan view (A) and a sectional view (B) describing the circuit device of the present invention.

FIG. 2 is a plan view (A), a back surface view (B), and a sectional view (C) describing the circuit device of the present invention.

FIG. 3 is a back surface view (A) and a sectional view (B) describing the circuit device of the present invention.

FIG. 4 is a sectional view (A) and a plan view (B) describing the circuit device manufacturing method of the present invention.

FIG. 6 is a sectional view (A) and a plan view (B) describing the circuit device manufacturing method of the present invention.

FIG. 7 is a sectional view (A) and a plan view (B) describing the circuit device manufacturing method of the present invention.

FIG. 8 is a sectional view (A) and a plan view (B) describing the circuit device manufacturing method of the present invention.

FIG. 9 is a sectional view (A) and a plan view (B) describing the circuit device manufacturing method of the present invention.

FIG. 10 is a sectional view (A) and a plan view (B) describing the circuit device manufacturing method of the present invention.

FIG. 11 is a sectional view (A) and a plan view (B) describing the circuit device manufacturing method of the present invention.

FIG. 12 is a sectional view (A), a sectional view (B), and a plan view (C) describing the circuit device manufacturing method of the present invention.

DESCRIPTION OF THE PREFERRED EMBODIMENTS (First Embodiment that Describes the Structure of a Circuit Device 10)

Figure 1A:
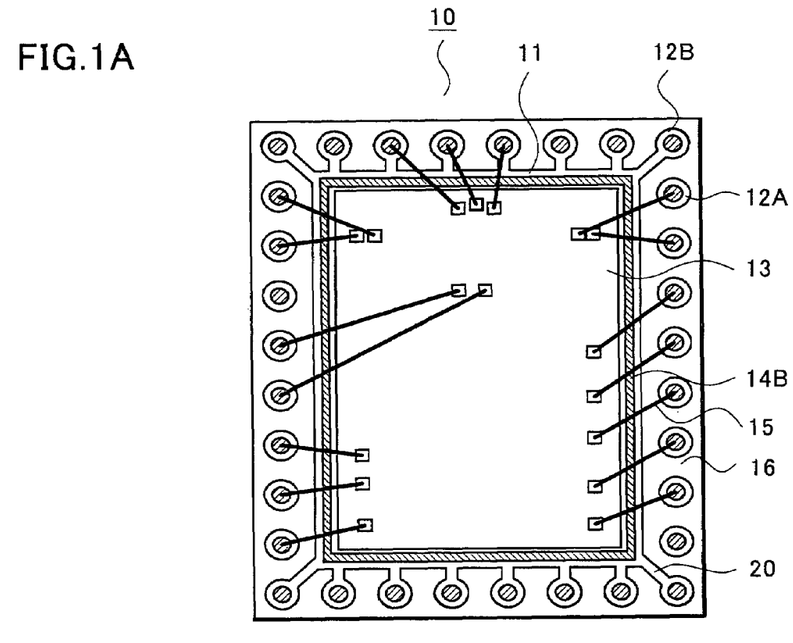
Figure 1B:
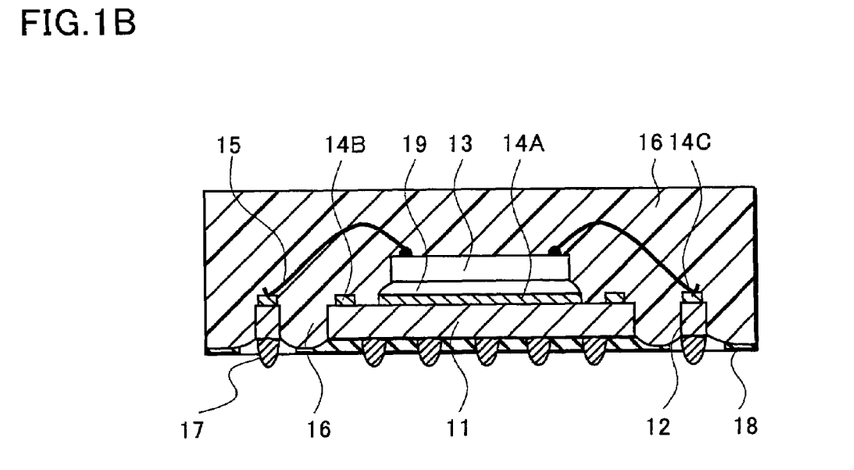

A description will be given mainly of the structure of the circuit device 10 of the present invention with reference to FIG. 1. FIG. 1(A) is a plan view of the circuit device 10, and FIG. 1(B) is a sectional view of the circuit device 10.

Referring to FIG. 1(A) and FIG. (B), the circuit device 10 is constructed as follows. That is, the circuit device 10 has a die pad 11 on which a semiconductor element 13 is mounted with a brazing material 19, a bonding pad 12 disposed in close vicinity to the die pad 11, and plating films formed on a surface of the die pad 11 and on a surface of the bonding pad 12, respectively, in which a second plating film 14B for preventing the brazing material 19 from overflowing is disposed around and apart from a first plating film 14A on which the semiconductor element 13 of the die pad 11 is mounted, and the brazing material 19 that has overflowed from the first plating film 14A is prevented from flowing out by a space between the first and second plating films. These constituent elements will be described as follows.

The die pad 11 is a conductive pattern on which the semiconductor element 13 is mounted, which is made of a metal, such as a copper foil, and which is embedded in an insulating resin 16 while exposing the back surface thereof outward. The planar size of the die pad 11 is formed slightly larger than the semiconductor element 13 to be mounted, and the second plating film 14B is formed therearound. In FIG. 1(A), the die pad 11 is formed at the center, and the semiconductor element 13 such as an IC chip, etc., is mounted there with the brazing material 19. The first plating film 14A of, for example, Ag is formed on the surface of the die pad 11 corresponding to an area where the semiconductor element 13 is mounted.

The bonding pad 12 is a conductive pattern to which a fine metal wire 15 is bonded and which is embedded in the insulating resin 16 while exposing the back surface thereof outward. Herein, a plurality of circular bonding pads 12 are disposed to enclose the die pad 11 formed at the center of the device. In FIG. 1(A), the bonding pads 12A formed on right and left sides of the die pad 11 are electrically independent of the die pad 11. The bonding pads 12B formed on upper and lower sides of the die pad 11 are spatially and electrically continuous with the die pad 11. A third plating film 14C of, for example, Ag is formed on the surface of the bonding pad 12 in order to improve bonding properties of the fine metal wire to be bonded.

The semiconductor element 13 is mounted on the surface of the die pad 11 with the brazing material 19. Herein, an IC chip having a relatively large size as a semiconductor element is mounted there with the brazing material 19. An electrode formed on the surface of the semiconductor element 13 is electrically connected to the bonding pad 12 through the fine metal wire 15. Likewise, the bonding pad 12 electrically connected to the die pad 11 is also electrically connected to the semiconductor element 13 through the fine metal wire 15. Herein, an electroconductive adhesive, such as solder or Ag paste, can be used as the brazing material.

The insulating resin 16 seals the whole of the device while exposing the back surface of the die pad 11 and the back surface of the bonding pad 12 outward. Furthermore, a groove 14 formed in the surface of the die pad 11 is filled with the insulating resin 16. Herein, the semiconductor element 13, the fine metal wire 15, the die pad 11, and the bonding pad 12 are sealed therewith. A thermosetting resin formed by transfer molding or a thermoplastic resin formed by injection molding can be employed as the material of the insulating resin 16.

The brazing material 19 is a conductive paste, such as solder or Ag paste, and functions to bond the semiconductor element 13 and the die pad 11 together. Since the brazing material 19 is a conductive material, the back surface of the semiconductor element 13 is electrically connected to the die pad 11. Furthermore, the bonding pads 12B formed on the upper and lower sides of the die pad 11 are also electrically connected to the die pad 11. Therefore, a circuit formed on the surface of the semiconductor element 13 can be electrically connected to the back surface of the semiconductor element 13 by connecting the electrode of the semiconductor element 13 to the bonding pads 12B through the fine metal wires 15.

Figure 2A:
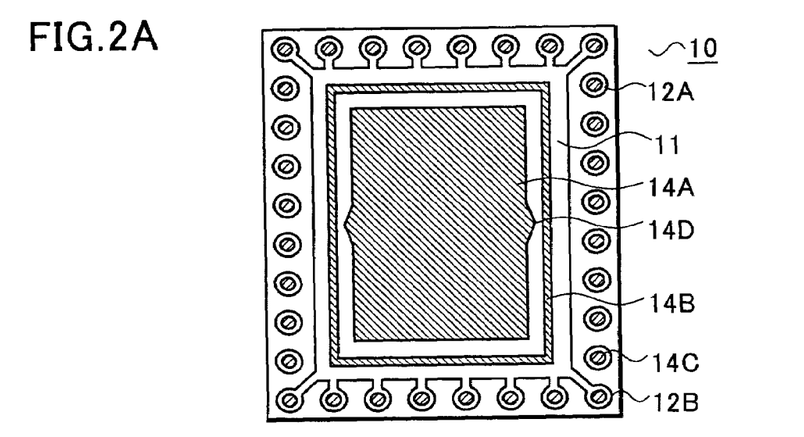

Referring to FIG. 2(A), a description will be given of the plating film formed on the surface of the die pad 11 and on the surface of the bonding pad 12. In this plan view, only the die pad 11, the bonding pad 12, and the plating films formed on both pads are shown without the semiconductor element 13 and the fine metal wire 15. The first plating film 14A corresponding to an area where the semiconductor element 13 is placed and the second plating film 14B provided around and apart from the first plating film 14A are formed on the surface of die pad 11. Additionally, a third plating film 14C is provided on the surface of the bonding pad 12. Silver, nickel, or gold can be employed as the material of the plating film 14.

The first plating film 14A is provided correspondingly to the area where the semiconductor element 13 is disposed, and the shape and size thereof are nearly equal to those of the semiconductor element 13. In order to cause the brazing material 19 to flow evenly rightward and leftward when the semiconductor element 13 is mounted by use of the brazing material, a convex portion 14D is provided at the middle of each of the opposite sides of the first plating film 14A. The convex portion 14D is formed by deforming a part of the periphery of the first plating film 14A. Herein, the convex portion 14D is formed to project outward.

The second plating film 14B is formed at the periphery of the die pad 11 so as to enclose the first plating film 14A apart from the first plating film 14A. When the semiconductor element 13 is mounted by use of the brazing material 19, the brazing material 19 overflows from the part in the vicinity of the convex portion 14D of the first plating film 14A. However, the brazing material 19 is prevented from flowing out from the die pad 11 by a stepped portion formed by the second plating film 14B. Additionally, since the material of the second plating film 14B is excellent in wettability with respect to the brazing material, the brazing material 19 that has overflowed from the first plating film 14A and has reached the second plating film 14B flows along the inner part of the second plating film 14B.

The present invention is characterized in that an area in which the second bonding pad 12B is in contact with the insulating resin 16 is increased by connecting the second bonding pad 12B to the die pad 11 through a wiring portion 20 narrow in width, so that joining is strengthened between the bonding pad 12A and the insulating resin 16. Concretely, since the die pad 11 and the second bonding pad 12B are electrically connected together as mentioned above, it is also possible to form a rectangular land where both of the pads are unified. However, in the present invention, the second bonding pad 12B is circularly formed, and is unified with the rectangular die pad 11 through the narrow wiring portion 20.

This structure makes it possible to increase the area of the side surface of the second bonding pad 12B and the wiring and to increase an area coming in contact with the insulating resin 16. Therefore, joining is very strong among the bonding pads 12B and the die pad 11, which are unified through the wiring portion 20, and the insulating resin 16. Therefore, the bonding pad and the die pad 11 can be prevented from being separated from the insulating resin 16.

Figure 2B:
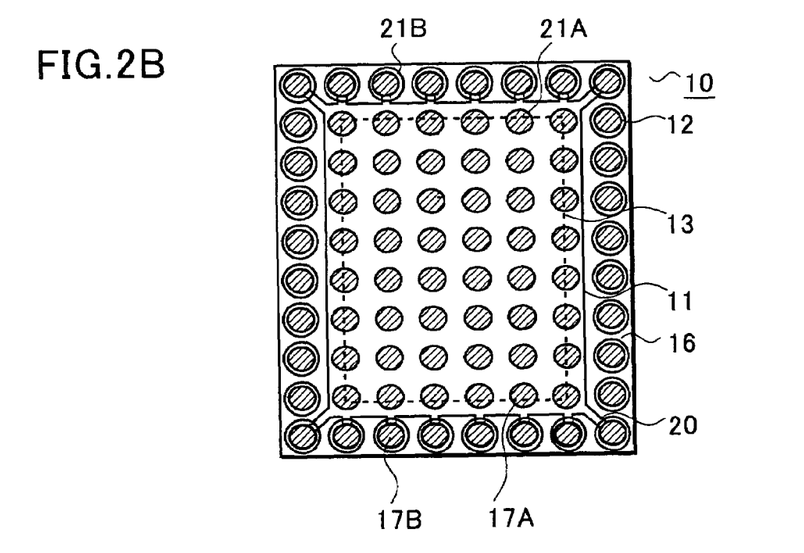
Figure 2C:
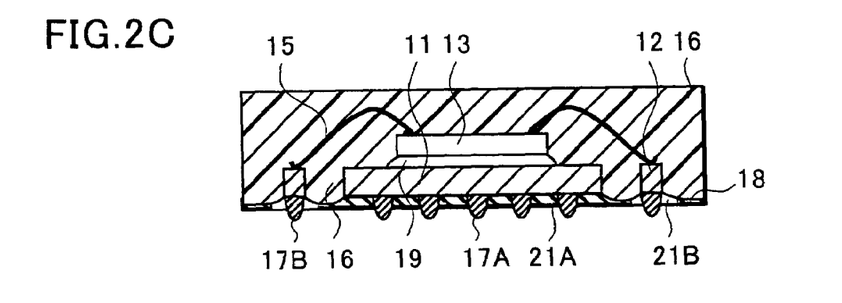

Referring to FIG. 2(B) and FIG. 2(C), a description will be given of an external electrode 17 formed on the back surface of the circuit device 10. The circuit device 10 of the present invention comprises the die pad 11 on which the semiconductor element 13 is mounted, the bonding pads 12 arranged to enclose the die pad 11, a first external electrode 17A disposed on the back surface of the die pad 11, a second external electrode 17B disposed on the back surface of the bonding pad 12, and a resist that has openings 21 at positions corresponding to the first and second external electrodes and that covers the back surfaces thereof, in which the opening 21A of the resist 18 disposed at the position corresponding to the second external electrode 17B is formed larger than the bonding pad 12, and the size of the second external electrode 17B is restricted according to wettability of the back surface of the bonding pad 12 exposed from the opening 21A and according to an amount of a brazing material, which is a material of the external electrode 17, applied onto the back surface of the bonding pad 12. These constituent elements will be described as follows. Herein, a description of the constituent elements described with reference to FIG. 1 is omitted to avoid repetition thereof.

A plurality of the first external electrodes 17A are disposed on the back surface of the die pad 11 like a matrix, and are made of a brazing material such as solder. The position and size of the first external electrode 17A are restricted by the first opening 21A formed in the resist 18. Therefore, the planar size of the first external electrode 17A is equal to the size of the first opening 21A disposed in the resist 18.

The second external electrode 17B is provided on the back surface of each of the bonding pads 12 arranged to enclose the die pad 11. Furthermore, since the bonding pad 12 is exposed from the second opening 21B of the resist 18, the second external electrode 17B is formed inside the second opening 21B. Herein, the size of the second opening 21B of the resist 18 is provided larger than that of the back surface of the bonding pad 12B exposed therefrom. Therefore, the back surface of the bonding pad 12 and the back surface of the insulating resin 16 are exposed outward from the second opening 21B. Accordingly, when a brazing material is applied and melted onto the bonding pad 12 in a step of forming the external electrode 17, the external electrode 17B is formed only at a part of the bonding pad 12 having excellent wettability with respect to solder. Therefore, the planar shape of the second external electrode 17B becomes identical to that of the bonding pad 12.

The wiring portion 20 is a portion connecting the bonding pad 12 and the die pad 11 together, and the width of the wiring portion 20 is narrower than the diameter of the bonding pad 12. The area of the side face of the die pad 11 and the bonding pad 12 formed integrally can be increased by making the width of the wiring portion 20 narrower in this way. Additionally, although a part of the wiring portion 20 is exposed outward from the second opening 21B larger than the bonding pad 12, the area of the exposed part can be minimized by making the width narrower as mentioned above. There is a possibility that the wiring portion 20 exposed when the second external electrode 17B is formed be wetted by the molten brazing material, and the second external electrode 17B be deformed from the circular shape to other shapes. Therefore, the deformation of the second external electrode 17B caused by the brazing material wetting the wiring portion 20 can be minimized by narrowing the width of the wiring portion 20 as mentioned above.

The first external electrode 17A and the second external electrode 17B mentioned above are evenly spaced like a matrix on the back surface of the circuit device 10. The external electrodes 17 are substantially identical in size to each other. Therefore, the stress acting on each of the external electrodes 17 can be reduced by mounting the circuit device 10 on a mounting board, such as a motherboard, through the external electrodes 17.

Figure 3A:
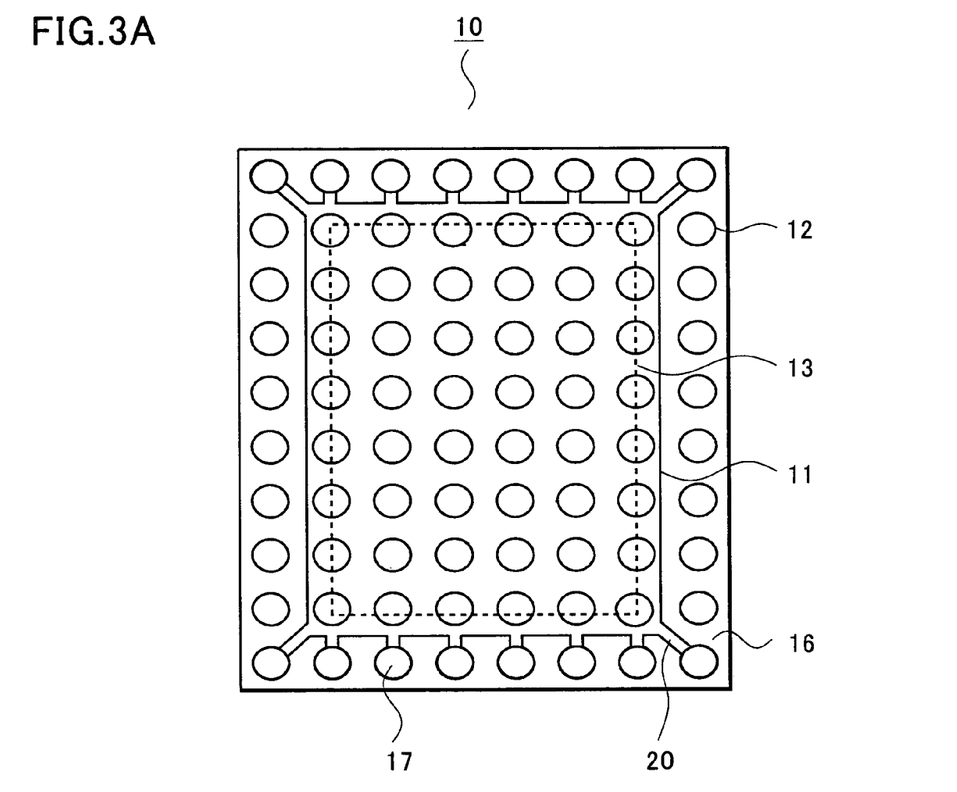
Figure 3B:
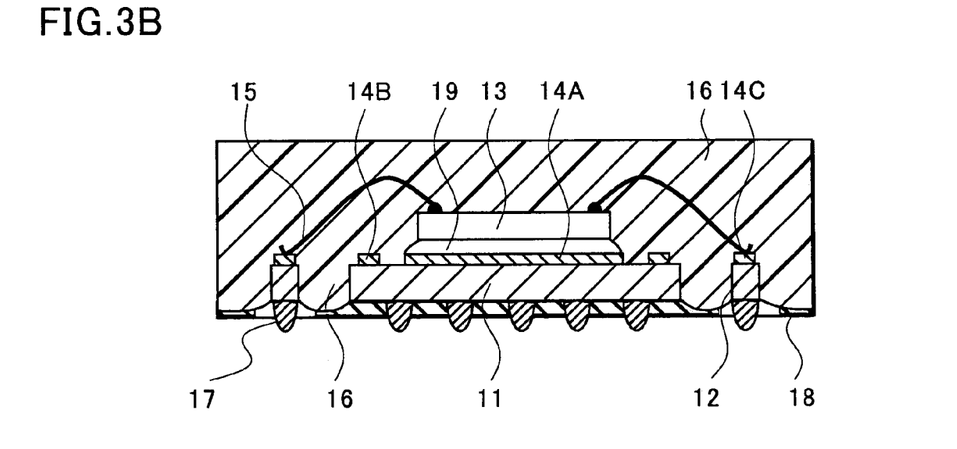

Referring to FIG. 3, a description will be given of the external electrode 17 formed on the back surface of the circuit device. The external electrode 17 is provided on the back surface of the bonding pads 12 arranged to enclose the die pad 11. Likewise, a plurality of external electrodes are provided on the back surface of the die pad 11, and therefore a plurality of the external electrodes 17 are evenly spaced like a matrix in the whole area of the back surface of the circuit device 10. Accordingly, the stress acting on the external electrode 17 can be reduced when the circuit device 10 is mounted on a mounting board, such as a motherboard, through the external electrode 17.

Referring to FIG. 3(B), the position and size of the external electrode 17 formed on the back surface of the die pad 11 are restricted by the opening of the resist 18. The position and size of the external electrode 17 formed on the back surface of the bonding pad 12 are restricted by the back surface of the bonding pad 12. A metal, such as copper, used as the material of the bonding pad 12 is excellent in wettability, and the position and size of the external electrode 17 are restricted by this wettability. Thus, the external electrode 17 can be formed with high accuracy by restricting the position and size of the external electrode 17 formed on the back surface of the bonding pad 12 in accordance with the wettability of the bonding pad 12, even when the opening of the resist 18 deviates from a normal position.

The present invention is characterized in that the second plating film 14B is disposed to be apart from the first plating film 14A formed in the area where the semiconductor element 13 of the die pad 11 is placed and to enclose the first plating film 14A. When the semiconductor element 13 is mounted on the first plating film 14A with the brazing material 19, the molten brazing material 19 overflows from the first plating film 14A because of, for example, the weight of the semiconductor element 13. A stepped portion is formed by the second plating film 14B disposed to enclose the first plating film 14A, and this stepped portion functions as a blocking area where the brazing material 19 is blocked from overflowing. Therefore, the brazing material 19 that has overflowed from the first plating film 14A is stored in the space formed between the first plating film 14A and the second plating film 14B. Therefore, the brazing material 19 that has overflowed by mounting the semiconductor element 13 can be prevented from flowing out from the die pad 11. As a result, the brazing material 19 that has overflowed from the first plating film 14A can be prevented from causing a short circuit between the die pad 11 and the bonding pad 12.

The present invention is further characterized in that convex portions 14D are provided at both sides, respectively, of the first plating film 14A. Accordingly, the brazing material 19 can be caused to evenly flow out from both sides when the semiconductor element 13 is mounted by use of the molten brazing material 19. Therefore, the semiconductor element 13 can be prevented from slanting resulting from an uneven flow of the brazing material 19. Furthermore, the thickness of the brazing material 19 can be evened.

A further advantage obtained by providing the second plating film 14B is as follows. The brazing material 19 is applied onto the surface of the die pad 11 by use of a machine, such as a dispenser, for supplying brazing materials, and the minimum amount of the brazing material 20 that can be supplied by this dispenser is predetermined. Therefore, if the minimum amount supplied by the dispenser is greater than the amount of the brazing material 19 required for mounting the semiconductor element 13 on the die pad 11, there is a possibility that the brazing material 19 may flow out from the surface of the die pad 11. As a result, the overflow of the brazing material 19 can be prevented by providing the second plating film 14B.

(Second Embodiment that Describes a Method of Manufacturing the Circuit Device 10)

In this embodiment, a description will be given of a method of manufacturing the circuit device 10. The circuit device 10 is manufactured through the following steps in this embodiment. That is, the circuit device manufacturing method comprises a step of preparing a conductive foil 40; a step of forming die pads 11 and bonding pads 12 that constitute a plurality of circuit device portions 45 by forming a separation groove 16, which is smaller in thickness than the conductive foil 40, in the conductive foil 40; a step of forming a first plating film 14A on a surface of the die pad 11 corresponding to an area of a semiconductor element 13 to be fixed and, at the same time, forming a second plating film 14B so as to enclose the area thereof; a step of fixing the semiconductor element 13 onto the first plating film 14A with a brazing material 19; a step of performing wire bonding between the semiconductor element 13 and a desired bonding pad 12; a step of performing common molding by use of an insulating resin 16 so that the semiconductor element 13 is covered with the insulating resin 16 and the separation groove 16 is filled with the insulating resin 16; a step of removing a back surface of the conductive foil 40 until the insulating resin 16 is exposed; and a step of dicing the insulating resin 16 so as to be separated into each circuit device. Each step of the present invention will hereinafter be described with reference to FIG. 4 through FIG. 12.

Figure 4A:
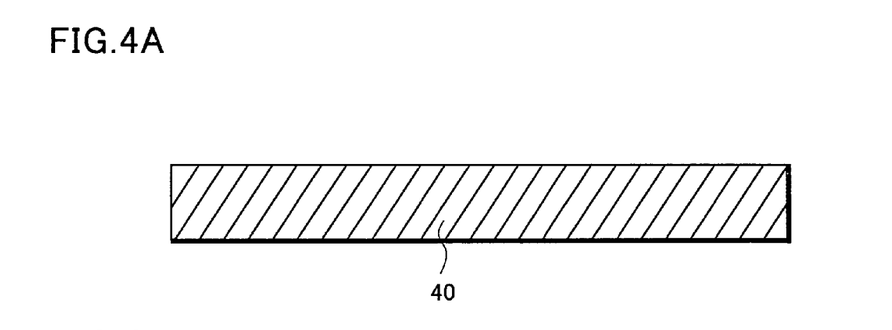
Figure 4B:
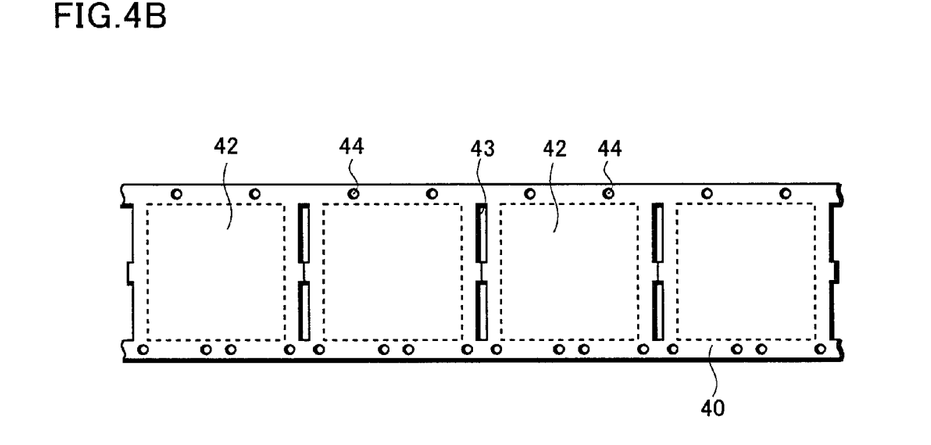
Figure 5:
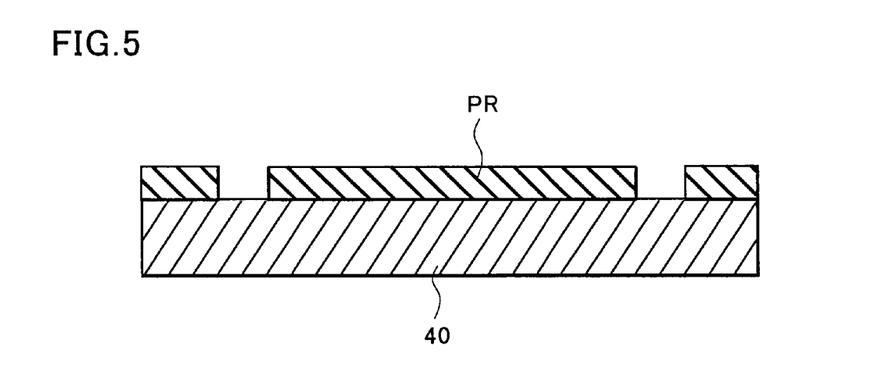
FIG. 5 is a sectional view describing the circuit device manufacturing method of the present invention.
Figure 6A:
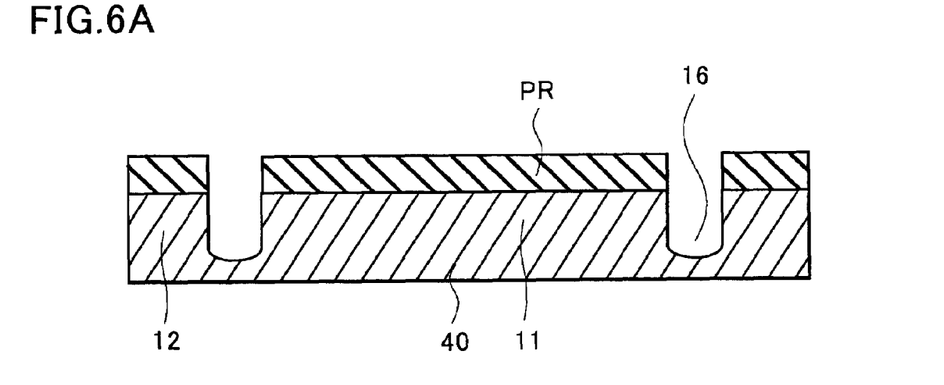
Figure 6B:
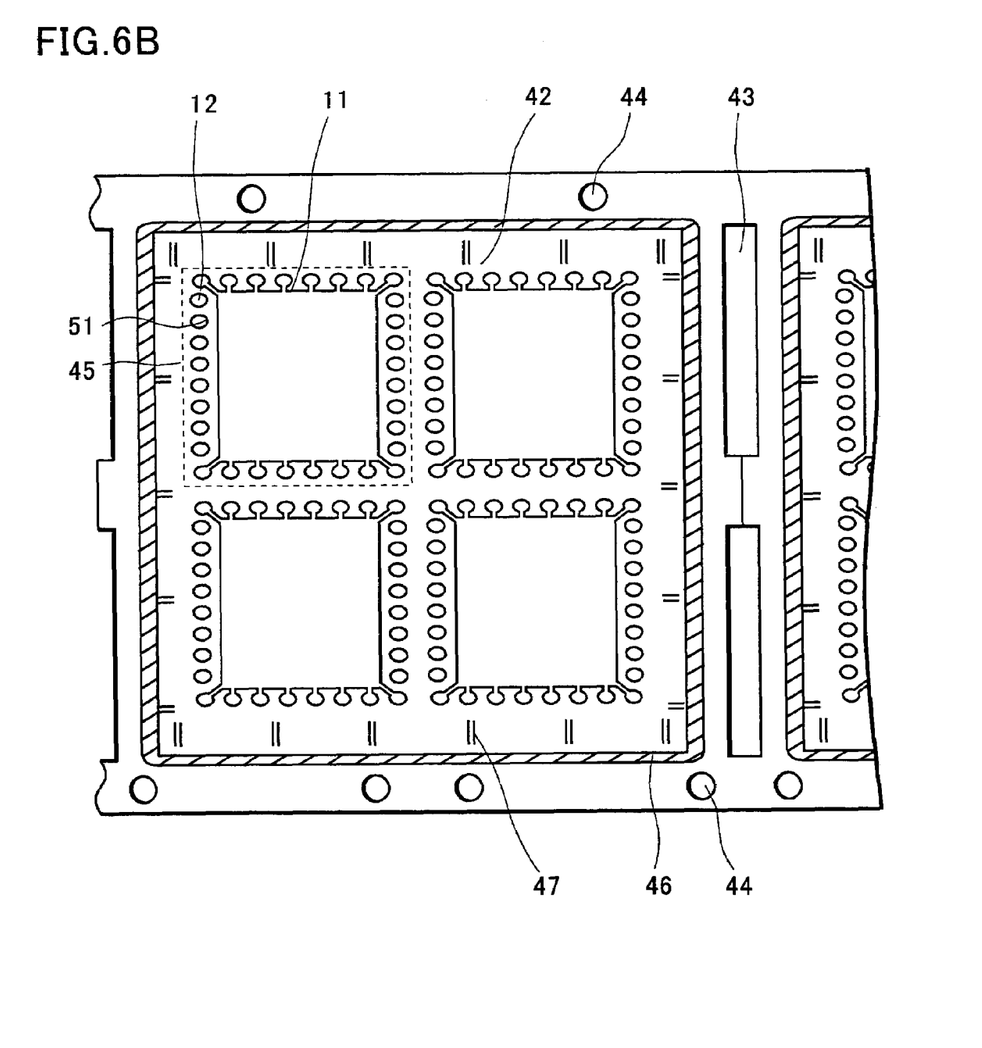

As shown in FIG. 4 through FIG. 6, the first step of the present invention is to prepare the conductive foil 40 and form the die pads 11 and the bonding pads 12 that constitute a plurality of circuit device portions 45 by forming a separation groove 16, which is shallower in thickness than the conductive foil 40, in the conductive foil 40.

As shown in FIG. 4(A), a sheet-shaped conductive foil 40 is first prepared in this step. The material for the conductive foil 40 is chosen in consideration of the adhesion, bonding strength, and plating property of the brazing material. The conductive foil 40 may be a conductive foil made mainly of Cu, a conductive foil made mainly of Al, or a conductive foil made of a Fe—Ni alloy.

The thickness of the conductive foil is preferably approximately 10 ìm to 300 ìm in consideration of etching performed in a later step. However, the conductive foil may be basically over 300 ìm or below 10 ìm in thickness. As will be described later, it is necessary to form the separation groove 16 shallower than the thickness of the conductive foil 40.

The sheet-shaped conductive foil 40 rolled in a predetermined width, e.g., 45 mm, may be prepared and carried into steps described later, or the conductive foils 40 cut in a predetermined size like strips may be prepared and carried into the later steps.

Concretely, four or five blocks 42 where a plurality of circuit device portions 45 are formed are arranged apart from each other on the strip-shaped conductive foil 40 as shown in FIG. 4(B). A slit 43 is provided between the blocks 42 so as to absorb the stress of the conductive foil 40 generated by heat treatment, for example, in a mold process. Index holes 44 are provided with regular intervals at upper and lower edges of the conductive foil 40 in order to perform positioning in each step.

Thereafter, a conductive pattern is formed. First, a photoresist (anti-etching mask) PR is formed on the conductive foil 40 as shown in FIG. 5, and is patterned so that the conductive foil 40 is exposed excluding areas that will serve as a conductive pattern 51. Thereafter, the conductive foil 40 is selectively etched as shown in FIG. 6(A). Herein, the conductive pattern 51 forms the die pad 11 and the bonding pad 12 of each circuit device portion 45.

FIG. 6(B) shows the conductive pattern 51 forming the die pad 11 and the bonding pad 12. This is a view that enlarges one of the blocks 42 shown in FIG. 4(B). An area surrounded by dashed line is one circuit device portion 45, and a plurality of circuit device portions 45 are arranged like a matrix of two rows and two lines in one of the blocks 42. The same conductive pattern 51 is provided for each circuit device portion 45. A frame-like pattern 46 is provided at the periphery of each block, and alignment marks 47 used in dicing are provided inside the pattern 46 and slightly apart therefrom. The frame-like pattern 46 is used for fitting with a mold die, and serves to reinforce the insulating resin 16 after the back surface of the conductive foil 40 is etched. In each circuit device portion, the bonding pads 12 formed on the upper and lower sides of the die pad 11 are unified with the die pad 11, and an electric connection is formed between the bonding pad 12 and the die pad 11.

Figure 7A:
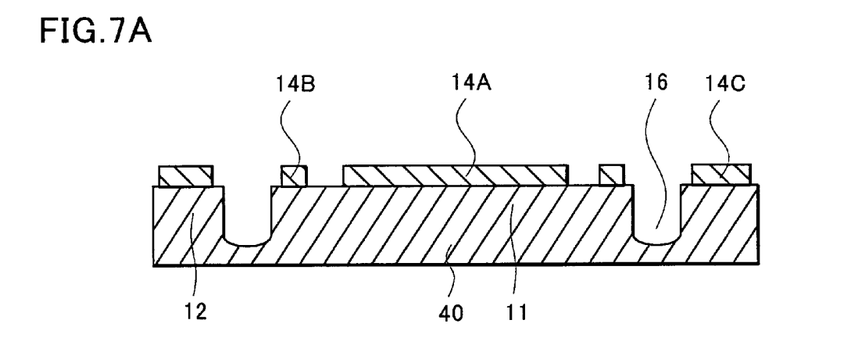
Figure 7B:
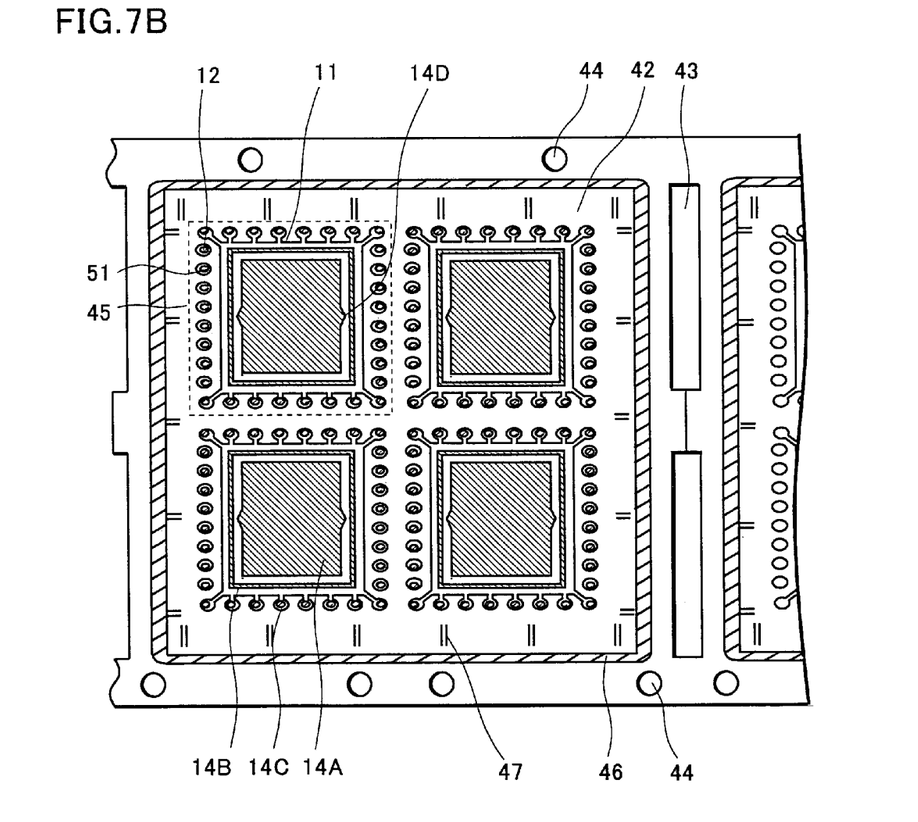

The second step of the present invention is to form the first plating film 14A on the surface of the die pad 11 corresponding to an area of the semiconductor element 13 to be fixed as shown in FIG. 7 and, at the same time, form the second plating film 14B so as to enclose the area thereof. Furthermore, in this step, the third plating film 14C is formed on the surface of the bonding pad 12.

In this step, a resist is first formed at a place excluding the first plating film 14A, the second plating film 14B, and the third plating film 14C that are to be formed. The plating films are then formed according to an electroplating method or an electroless plating method. Herein, silver, nickel, or gold can be employed as the material of the plating film. Furthermore, a convex portion 14D is formed on each side of the first plating film 14A shaped like a rectangle.

Figure 8A:
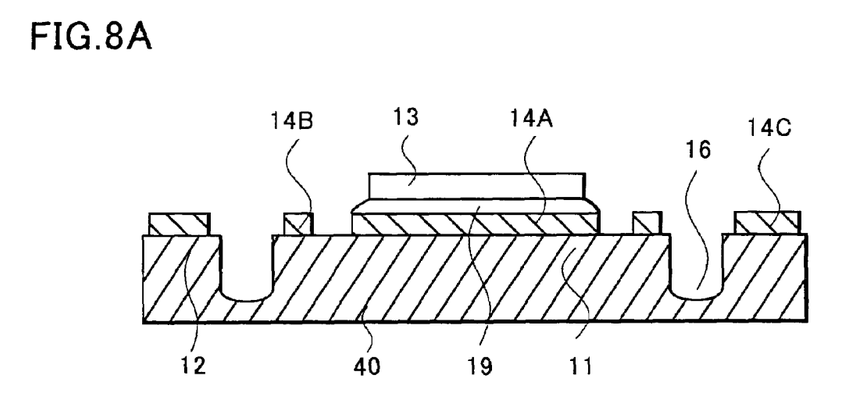
Figure 8B:
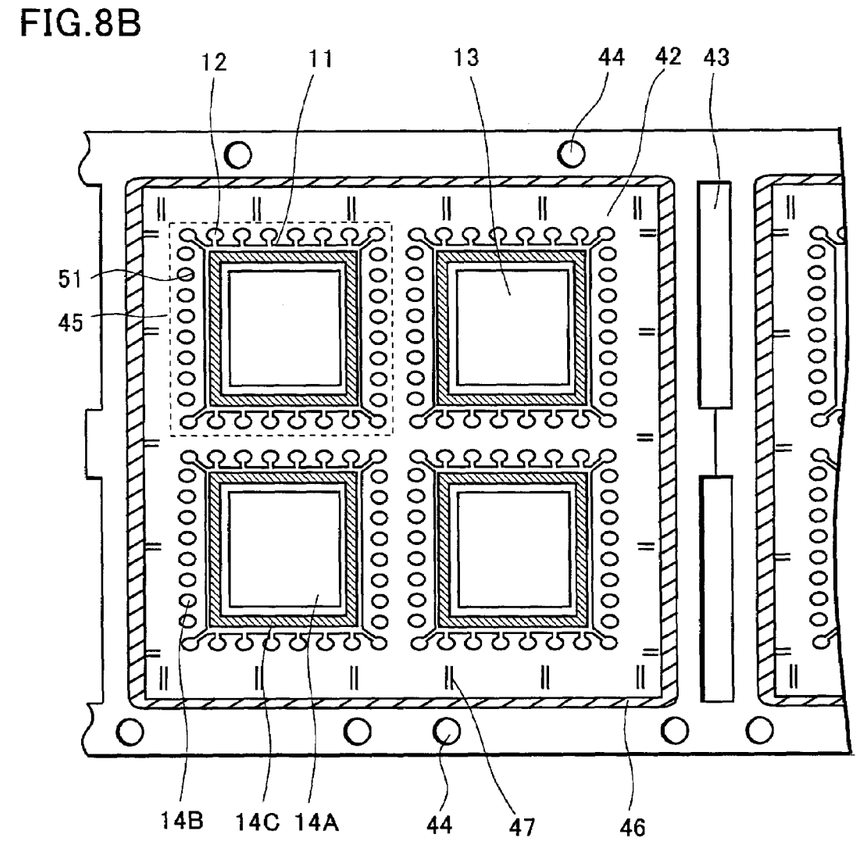
Figure 9A:
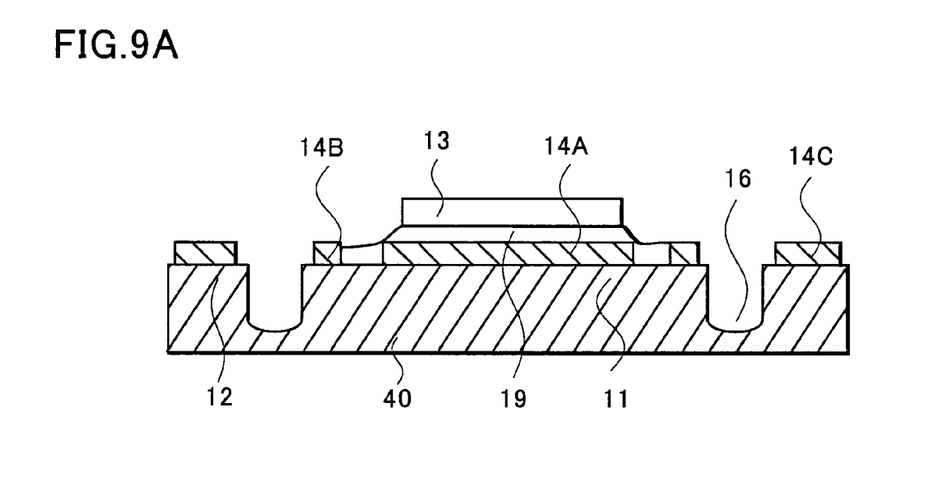
Figure 9B:
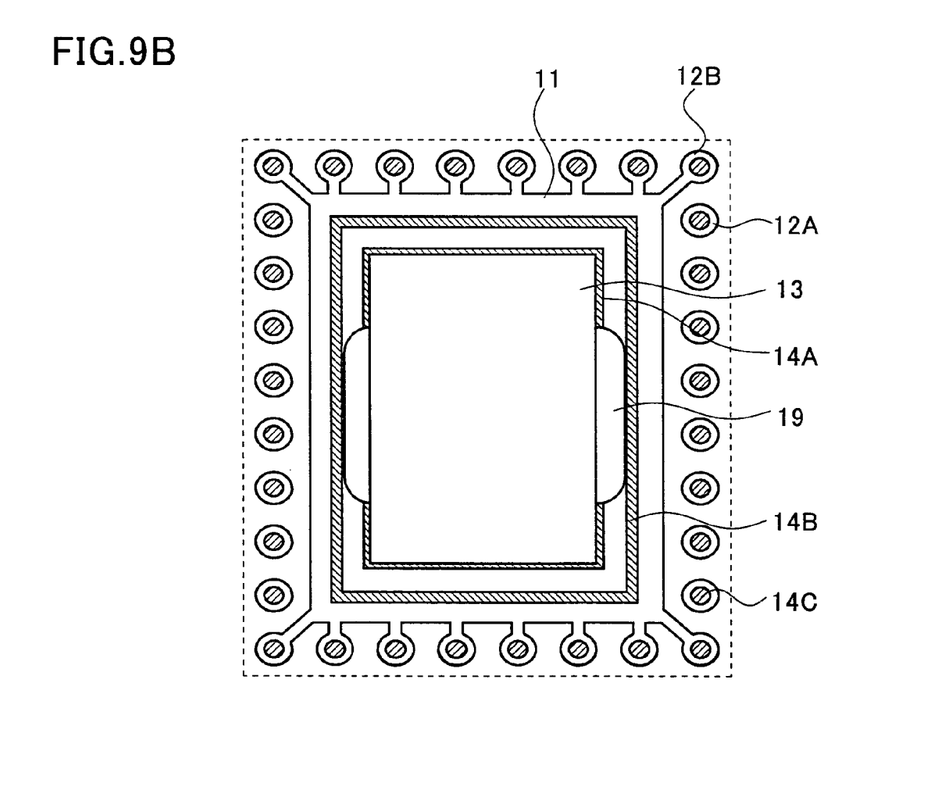

The third step of the present invention is to fix the semiconductor element 13 onto the first plating film 14A with the brazing material 19 as shown in FIG. 8 and FIG. 9.

Referring to FIG. 8(A), the semiconductor element 13 is mounted on the first plating film 14A formed on the surface of the die pad 11 by use of the brazing material 19. Herein, a conductive paste, such as solder or Ag paste, is used as the brazing material 19. Since the brazing material 19 is in a molten state in this step, the brazing material 19 overflows from the first plating film 14A because of, for example, the weight of the semiconductor element 13 when the semiconductor element 13 is placed on the upper part of the brazing material 19. However, the brazing material 19 that has spread does not flow out from the die pad 11, because the second plating film 14B is formed at the periphery of the die pad 11 so as to enclose the area where the semiconductor element 13 is placed. The brazing material 19 that has reached the second plating film 14B is stored in a space between the first plating film 14A and the second plating film 14B. Therefore, the second plating film 14B functions as a blocking area where the brazing material 19 is blocked from flowing out. Therefore, the brazing material 19 does not flow out from the surface of the die pad 11, and a short circuit can be prevented from arising between the die pad 11 and the bonding pad 12.

Referring to FIG. 9, a description will be given of the operation of the convex portions 14D provided on both sides of the first plating film 14A. FIG. 9(A) is a sectional view showing that the brazing material 19 has flowed out from the first plating film 14A in this step, and FIG. 9(B) is its plan view.

Referring to FIG. 9(A) and FIG. 9(B), the brazing material 19 overflows from the first plating film 14A when the semiconductor element 13 is placed on the upper part of the molten brazing material 19. Herein, since the convex portions 14D are formed on both sides (in this embodiment, on the right and left sides) of the first plating film 14A, the brazing material 19 preferentially flows out from the part of the convex portion 14D, and flows out evenly rightward and leftward. From this fact, the thickness of the brazing material 19 is maintained constant, and the semiconductor element 13 to be fixed using the brazing material 19 is mounted maintaining parallelism. The heat radiating properties of the semiconductor element 13 can be improved by keeping the thickness of the brazing material 19 fixed. Since the semiconductor element 13 is mounted in parallel, it is possible to accurately discern the position of the semiconductor element 13, which is performed using the reflection of light on the surface of the semiconductor element 13. Therefore, a wire bonding step following the positional discernment thereof can be carried out stably.

Figure 10A:
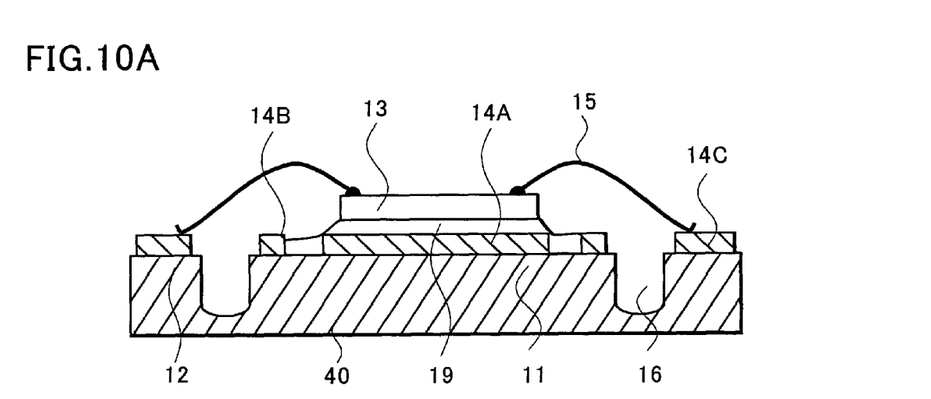
Figure 10B:
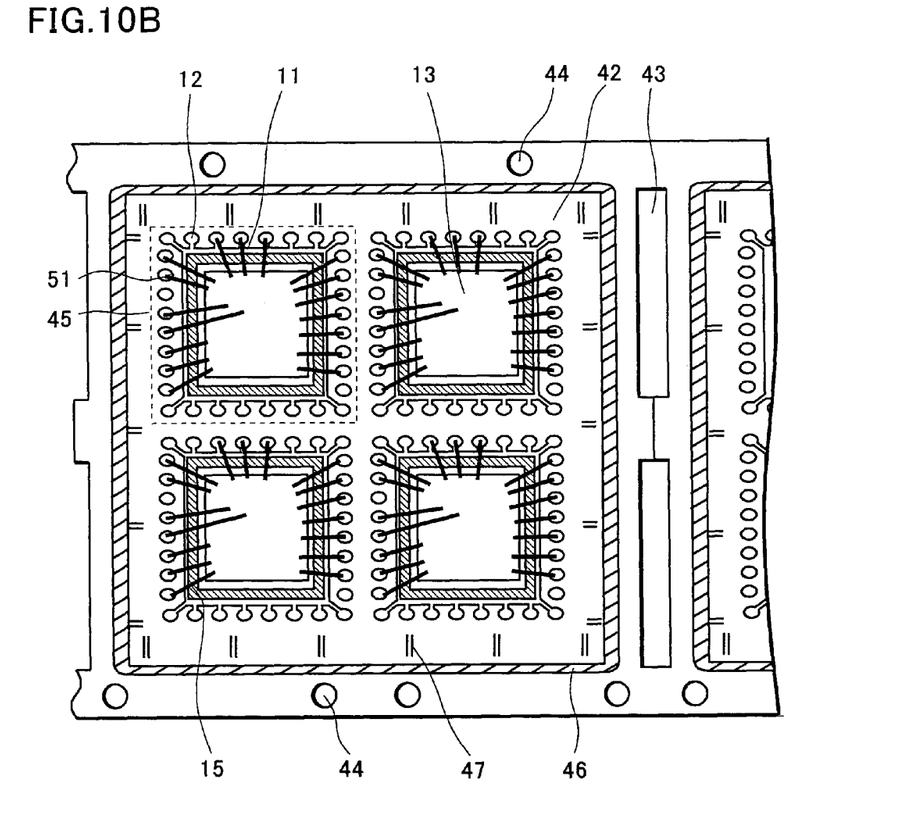

The fourth step of the present invention is to perform wire bonding between the semiconductor element 13 and a desired bonding pad 12 as shown in FIG. 10.

Concretely, electrodes of the semiconductor element 13 and desired bonding pads 12 mounted on each circuit device portion 45 are subjected to wire bonding together according to ball bonding by thermocompression and wedge bonding by ultrasonic waves.

The positional discernment of the semiconductor element 13 is carried out by use of the reflection of light irradiated onto the surface of the semiconductor element 13 in this step, and, since the semiconductor element 13 is mounted in parallel with the conductive foil 40 in the previous step, accurate positional discernment of the semiconductor element 13 can be carried out.

Figure 11A:
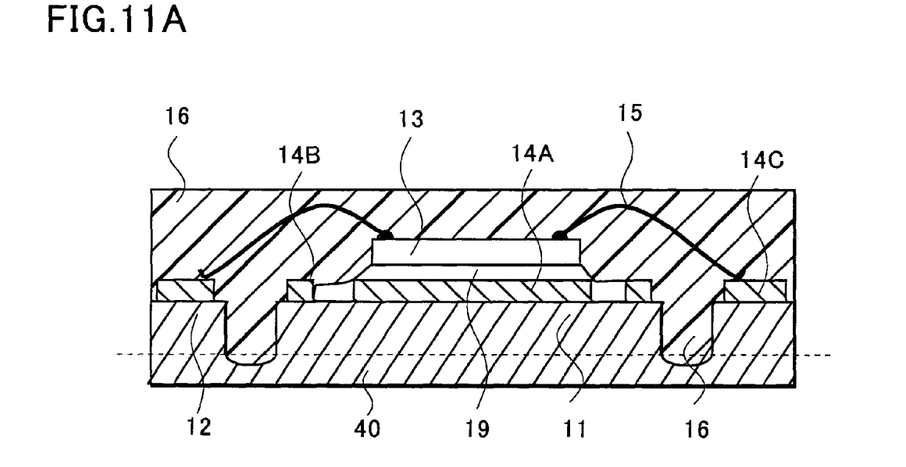
Figure 11B:
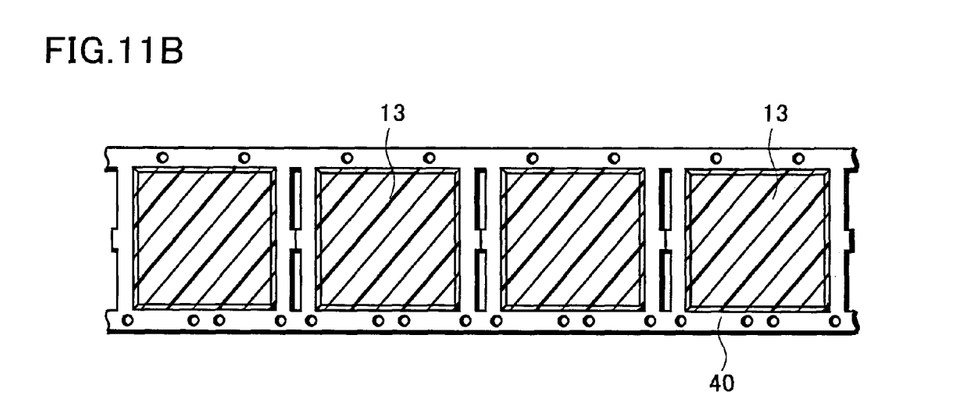

The fifth step of the present invention is to perform common molding by use of the insulating resin 16 with which the semiconductor element 13 is covered and with which the separation groove 16 is filled, as shown in FIG. 11.

As shown in FIG. 11(A), in this step, the semiconductor element 13 and the plurality of die pads 11 and bonding pads 12 are completely covered with the insulating resin 16, and the separation groove 16 and the groove 14 are filled with the insulating resin 16. These are strongly unified by fitting with the separation groove 16. The die pad 11 and the bonding pad 12 are supported by the insulating resin 16.

Transfer molding, injection molding, or potting can also be used in this step. As the resinous material, a thermosetting resin, such as epoxy resin, can be realized by transfer molding, and a thermoplastic resin, such as polyimide resin or polyphenylene sulfide, can be realized by injection molding.

Furthermore, when the transfer molding or injection molding is performed in this step, each block 42 allows one common mold die to contain the circuit device portion 63, and the molding is performed in common by one insulating resin 16 per block, as shown in FIG. 11(B). For this reason, the amount of resin can be reduced much greater than in the method of individually molding each circuit device portion like the conventional transfer molding.

This step is characterized in that the conductive foil 40 serving as the conductive pattern 51 is used as a supporting substrate until it is covered with the insulating resin 16. The conductive pattern is formed by employing a supporting substrate that is not originally needed in the conventional technique, whereas the conductive foil 40 to be used as a supporting substrate is necessary as the electrode material in the present invention. Therefore, there is an advantage in that the work can be carried out by omitting the constituent material as much as possible and in that costs can be reduced.

Since the depth of the separation groove 41 is shallower than the thickness of the conductive foil, the conductive foil 40 is not separated individually as the conductive pattern 51. Accordingly, the present invention is characterized in that the sheet-shaped conductive foil 40 can be handled as one piece, and particularly in molding the insulating resin 16, the work of carrying the conductive foil 40 to the mold, and mounting it onto the mold is considerably facilitated.

The sixth step of the present invention is to remove the back surface of the conductive foil 40 until the insulating resin is exposed.

This step is for removing the back surface of the conductive foil 40 chemically and/or physically and separate it as the conductive pattern 51. This step is carried out by polishing, grinding, etching, laser metal evaporation, etc.

In an experiment, the whole surface of the conductive foil 40 is subjected to wet etching so as to expose the insulating resin 16 from the separation groove 41. This surface to be exposed is shown by the dotted line in FIG. 11(A). As a result, it is separated as the conductive pattern 51. Accordingly, the back surface of the conductive pattern 51 is exposed to the insulating resin 16. In other words, the surface of the insulating resin 16 with which the separation groove 41 is filled substantially coincides with the surface of the conductive pattern 51.

Furthermore, treatment is applied to the back surface of the conductive pattern 51, and the final structure shown, for example, in FIG. 1 is obtained. That is, a conductive material, such as solder, is applied onto the conductive pattern 51 exposed according to need, so as to be completed as a circuit device.

Figure 12A:
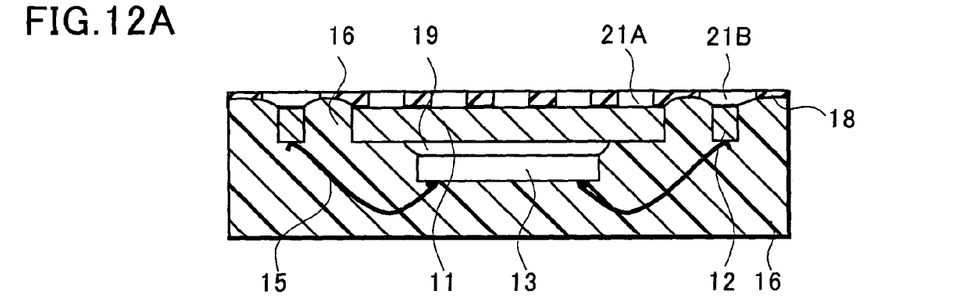
Figure 12B:
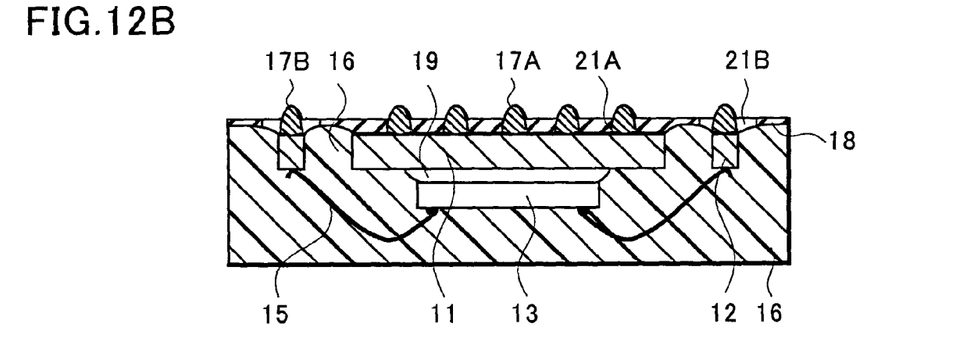

The seventh step of the present invention is to, as shown in FIG. 12(A) and FIG. 12(B), provide external electrodes on the back surface of the die pad 11 and on the back surface of the bonding pad 12.

Referring to FIG. 12(A), the resist 18 is first applied to a surface of the insulating resin 16 where the die pad 11 and the bonding pad 12B are exposed, and an opening 21 is formed in the part where the external electrode 17 is formed. Concretely, first openings 21A are provided like a matrix in the back surface of the die pad 11, and second openings 21B are provided in the part where the bonding pad 12B is exposed. The size of the second opening 21B is formed larger than that of the bonding pad 12. Therefore, the second external electrode 17B is accurately formed even if the planar position of the opening 21 formed in the resist 18 deviates, because the position of the second external electrode formed on the back surface of the bonding pad 12 is restricted by the wettability of the back surface of the bonding pad 12.

Referring to FIG. 12(B), the first external electrode 17A and the second external electrode 17B are then formed by adhering and melting a brazing material to each of the openings 21 of the resist. Herein, the position and size of the first external electrode 17A formed on the back surface of the die pad 11 are restricted by the first opening 21A. Likewise, the position and size of the second external electrode 17B formed on the back surface of the bonding pad 12 are restricted by the wettability of the back surface of the bonding pad 12.

Figure 12C:
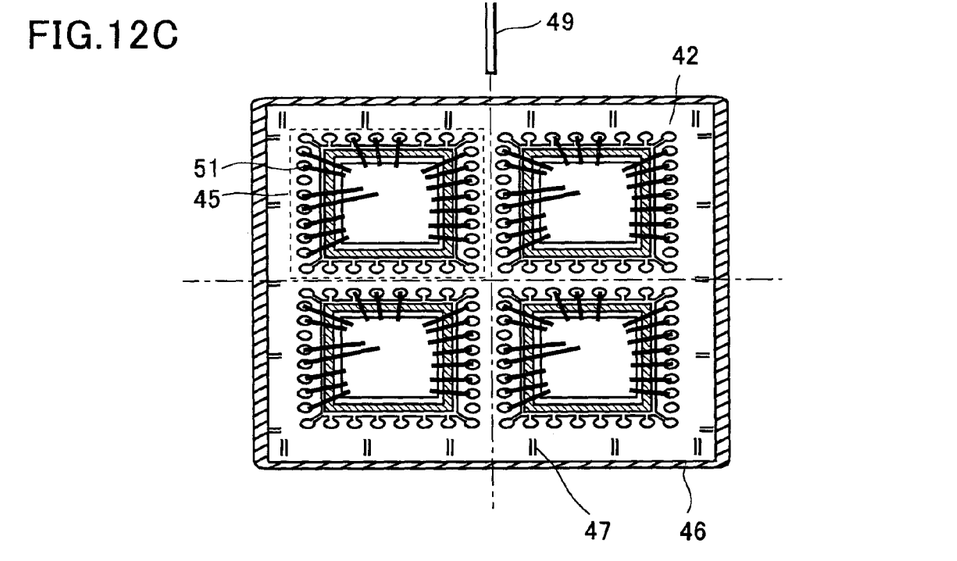

The eighth step of the present invention is to, as shown in FIG. 12(C), separate the insulating resin 16 for each circuit device portion 45 by dicing.

In this step, the block 42 is adsorbed to a mount of a dicing device by vacuum, and the insulating resin 16 of the separation groove 41 is diced with a dicing blade 49 along the dicing line (alternate long and short dash line) between the circuit device portions 45 so as to be separated into each individual circuit device.

Preferably, in this step, the dicing blade 49 grinds the insulating resin 16 to such a depth as to almost cut off the insulating resin 16, and, after the block 42 is taken from the dicing device, it is separated with a roller in a way as if to break a bar of chocolate. In the dicing process, the alignment marks 47 of each block provided in the first step are beforehand recognized, and, based on this, dicing is performed. As is well known, dicing is first performed in the longitudinal direction along all the dicing lines, and then the mount is rotated by 90 degrees, and dicing is performed in the lateral direction along the dicing line 70.

What is claimed is:

1. A circuit device comprising:
   a die pad on which a semiconductor element is mounted with a brazing material,
   a bonding pad disposed in close vicinity to the die pad, and
   plating films formed on a surface of the die pad and on a surface of the bonding pad, respectively,
   wherein a second plating film on the die pad is spaced apart from a first plating film on the die pad.

2. The circuit device of claim 1, wherein the second plating film prevents the brazing material from overflowing.

3. The circuit device of claim 1, wherein the second plating film prevents the brazing material that has overflowed from the first plating film from flowing out by a space between the first and second plating films.

4. The circuit device of claim 1, wherein convex portions are provided at both sides, respectively, of the first plating film.

5. The circuit device of claim 1, wherein the brazing material is spread around the first plating film by causing the brazing material to flow from the convex portions.

6. The circuit device of claim 4, wherein the semiconductor element is maintained in parallel by spreading the brazing material by the convex portions.

7. The circuit device of claim 1, wherein the semiconductor device is an IC chip.

8. The circuit device of claim 1, wherein the semiconductor element is electrically connected to the bonding pad through a fine metal wire.

9. The circuit device of claim 1 wherein a surface of the die pad is exposed between the first plating film and the second plating film.

10. A circuit device comprising:
    a die pad on which a semiconductor element is mounted, a first bonding pad disposed in close vicinity to the die pad and electrically separated from the die pad, a second bonding pad disposed in close vicinity to the die pad and formed integrally with the die pad, and an insulating resin for sealing the semiconductor element, the die pad, the first bonding pad, and the second bonding pad while exposing a back surface of the die pad, a back surface of the first bonding pad, and a back surface of the second bonding pad,
    wherein the second bonding pad is connected to the die pad through a wiring portion narrow in width.

11. The circuit device of claim 10, wherein an area in which the second bonding pad is in contact with the insulating resin is increased by providing the wiring portion, so that joining is strengthened between the bonding pad and the insulating resin.

12. The circuit device of claim 10, wherein a plurality of the first bonding pads are disposed along opposite sides of the die pad.

13. The circuit device of claim 12, wherein a plurality of the second bonding pads are disposed along the opposite sides of the die pad.

14. The circuit device of claim 10, wherein the semiconductor element is electrically connected to the first bonding pad and to the second bonding pad through fine metal wires.

15. The circuit device of claim 10, wherein the first bonding pad and the second bonding pad are formed circularly.

16. A circuit device comprising:
    a die pad on which a semiconductor element is mounted, bonding pads arranged to enclose the die pad, a first external electrode disposed on a back surface of the die pad, a second external electrode disposed on a back surface of the bonding pad, and a resist that has openings at positions corresponding to the first and second external electrodes and that covers the back surfaces thereof,
    wherein the opening of the resist formed at the position corresponding to the second external electrode is formed larger than the bonding pad.

17. The circuit device of claim 16, wherein a size of the second external electrode is restricted according to wettability of the back surface of the bonding pad exposing from the opening and according to an amount of a brazing material, which is a material of the external electrode, applied onto the back surface of the bonding pad.

18. The circuit device of claim 16, wherein the first external electrode is restricted in position and in size according to the opening of the resist.

* * * * *